US008546861B2

(12) United States Patent
Hwang

(10) Patent No.: US 8,546,861 B2
(45) Date of Patent: Oct. 1, 2013

(54) RESISTANCE CHANGE MEMORY DEVICE WITH THREE-DIMENSIONAL STRUCTURE, AND DEVICE ARRAY, ELECTRONIC PRODUCT AND MANUFACTURING METHOD THEREFOR

(75) Inventor: Hyun-Sang Hwang, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 109 days.

(21) Appl. No.: 13/254,690

(22) PCT Filed: Aug. 28, 2009

(86) PCT No.: PCT/KR2009/004854
§ 371 (c)(1),
(2), (4) Date: Sep. 2, 2011

(87) PCT Pub. No.: WO2010/101340
PCT Pub. Date: Sep. 10, 2010

(65) Prior Publication Data
US 2011/0309322 A1     Dec. 22, 2011

(30) Foreign Application Priority Data

Mar. 5, 2009   (KR) .................. 10-2009-0018722
Apr. 23, 2009  (KR) .................. 10-2009-0035445

(51) Int. Cl.
*H01L 27/108*       (2006.01)
(52) U.S. Cl.
USPC ............................... 257/298; 438/381
(58) Field of Classification Search
USPC .......... 257/2, 5, 314, 298; 365/129; 438/381
See application file for complete search history.

(56) References Cited

U.S. PATENT DOCUMENTS

| 7,952,163 | B2 * | 5/2011 | Baek et al. ............... 257/536 |
| 2004/0114428 | A1 | 6/2004 | Morikawa |
| 2006/0024886 | A1 | 2/2006 | Ferrant et al. |
| 2006/0094187 | A1 | 5/2006 | Hsu et al. |
| 2008/0128853 | A1 | 6/2008 | Choi et al. |
| 2008/0296550 | A1 | 12/2008 | Lee et al. |
| 2009/0251963 | A1 * | 10/2009 | Seol et al. ............... 365/185.05 |

FOREIGN PATENT DOCUMENTS

| JP | 2009-081251 A | 4/2009 |
| KR | 10-2008-0105979 A | 12/2008 |

OTHER PUBLICATIONS

Patent Abstracts of Japan, Publication No. JP2009-081251, dated Apr. 16, 2009, 1 page.
International Search Report issued in PCT/KR2009/004854, mailed on Mar. 23, 2010, with translation, 6 pages.
Written Opinion issued in PCT/KR2009/004854, mailed on Mar. 23, 2010, 4 pages.

* cited by examiner

*Primary Examiner* — David Vu
*Assistant Examiner* — Brandon Fox
(74) *Attorney, Agent, or Firm* — Osha Liang LLP

(57) ABSTRACT

Provided are a resistance change memory device with a three-dimensional structure, a resistance change memory device array, an electronic product, and a manufacturing method therefor. The device array includes a plurality of first directional data lines which are arranged on a substrate in parallel. A conductive pillar is positioned between sidewalls of the first directional data lines, which face each other. A resistance change material film is positioned between the sidewall of the conductive pillar and the sidewall of the data lines that are adjacent to the sidewall of the conductive pillar.

18 Claims, 20 Drawing Sheets

I - I'

IIa - IIa'      IIIa - IIIa'

RESISTANCE CHANGE MEMORY DEVICE WITH THREE-DIMENSIONAL STRUCTURE, AND DEVICE ARRAY, ELECTRONIC PRODUCT AND MANUFACTURING METHOD THEREFOR

CROSS-REFERENCE TO RELATED PATENT APPLICATION

This application claims the benefit of Korean Patent Application No. 10-2009-0018722, filed on Mar. 5, 2009 and No. 10-2009-0035445, filed on Apr. 23, 2009 in the Korean Intellectual Property Office, the disclosure of which is incorporated herein in its entirety by reference.

BACKGROUND OF THE INVENTION

1. Field of the Invention

The present invention relates to a non-volatile memory device and, more particularly, to a resistance change memory device.

2. Description of the Related Art

At present, in the case of a flash memory used as a non-volatile memory, a change in threshold voltage caused by storing or removing charges in or from a charge storage layer is used. The charge storage layer may be a floating gate as a polysilicon film or a charge trapping layer as a silicon nitride film. Recently, new next-generation non-volatile memory devices with lower power consumption and higher degree of integration than those of the flash memory device have been studied. Examples of the next-generation non-volatile memory devices include a phase change RAM (PRAM) device, a magnetic RAM (MRAM) device, and a resistance change RAM (ReRAM) device.

The PRAM device has been first commercialized among the next-generation non-volatile memory devices, but faced with the problem of difficulty in increasing the degree of integration. As an alternative, the ReRAM device has been developed, but a specific plan for increasing the degree of integration has not yet been studied.

BRIEF DESCRIPTION OF THE INVENTION

The present invention has been made in an effort to solve the above-described problems associated with prior art, and an object of the present invention is to provide a resistance change memory device with a three-dimensional structure which can increase the degree of integration, a resistance change memory device array, an electronic product, and a manufacturing method therefor.

According to an aspect of the present invention to achieve the above object of the present invention, there is provided a resistance change memory device array. The resistance change memory device array includes a pair of first directional data lines arranged parallel to each other on a substrate. A conductive pillar is positioned between sidewalls facing each other of the first data lines. A resistance change material layer is positioned between a sidewall of the conductive pillar and a sidewall of the data line adjacent to the sidewall of the conductive pillar.

Second directional data lines crossing the first directional data lines and arranged parallel to each other may be positioned on the first directional data lines. Here, the conductive pillar may be positioned in a space surrounded by the sidewalls facing each other of the first directional data lines and sidewalls of the second directional data lines.

A tunnel barrier insulating film may be positioned between the sidewall of the conductive pillar and the resistance change material layer or between the resistance change material layer and the data line.

The resistance change material layer may be a metal oxide layer, a PCMO ($Pr_{1-X}Ca_XMnO_3$, 0<X<1) layer, a chalcogenide layer, a perovskite layer, or a metal-doped solid electrolyte layer.

A selection device may be electrically connected to the conductive pillar. The selection device may be a selection transistor. Here, the selection transistor may be positioned at a cross point of a bit line and a word line crossing the bit line, respectively. Moreover, a gate of the selection transistor may be electrically connected to the word line, any one of source and drain of the selection transistor may be electrically connected to the bit line, and the other may be electrically connected to the conductive pillar.

When the selection device is a selection transistor, the selection transistor may include an active area defined by a device isolation film formed on the substrate and a word line crossing the active area. Also, the first directional data lines may be arranged parallel to each other on the word line, and the conductive pillar may be electrically connected to an active area exposed on one side of the word line. Further, the resistance change memory device array may further include a bit line electrically connected to an active area exposed on the other side of the word line and crossing the top of the word line.

According to another aspect of the present invention to achieve the above object of the present invention, there is provided a resistance change memory device. The resistance change memory device includes a conductive pillar, a data line overlapping a sidewall of the conductive pillar, and a resistance change material layer positioned between the sidewall of the conductive pillar and the data line.

The data line may include a pair of first directional data lines overlapping both sidewalls facing each other of the conductive pillar and arranged parallel to each other. Moreover, the data line may further include a pair of second directional data lines overlapping both sidewalls facing each other of the conductive pillar and arranged parallel to the first directional data lines over the top of the first directional data lines.

According to still another aspect of the present invention to achieve the above object of the present invention, there is provided a method for manufacturing a resistance change memory device. The manufacturing method includes forming a pair of first directional data lines arranged parallel to each other in a first direction on a substrate. A first interwire insulating film is formed on the first directional data lines. A hole exposing sidewalls facing each other of the first directional data lines is formed in the first interwire insulating film. A resistance change material layer covering the sidewalls of the data lines is formed in the hole. A conductive pillar is formed in the hole surrounded by the resistance change material layer.

Before forming the hole, a pair of second directional data lines crossing the first directional data lines and arranged parallel to each other may be formed on the first interwire insulating film, and a second interwire insulating film may be formed on the second directional data lines. Here, the hole may be formed in the second interwire insulating film and the first interwire insulating film to expose the sidewalls facing each other of the first directional data lines and sidewalls facing each other of the second directional data lines.

Before forming the resistance change material layer, a tunnel barrier insulating film covering the sidewalls of the data lines may be formed in the hole. Otherwise, before forming the conductive pillar, a tunnel barrier insulating film may be formed on the resistance change material layer.

Before forming the first directional data lines on the substrate, a device isolation film may be formed on the substrate to define an active area, and a word line crossing the active area may be formed. In this case, the first directional data lines may be formed on the word line, and the conductive pillar may be electrically connected to an active area exposed on one side of the word line.

According to yet another aspect of the present invention to achieve the above object of the present invention, there is provided an electronic product. The electronic product includes a resistance change memory device and a processor connected to the resistance change memory device, the resistance change memory device including a plurality of first directional data lines arranged parallel to each other on a substrate. A conductive pillar is positioned between sidewalls facing each other of the first data lines. A resistance change material layer is positioned between a sidewall of the conductive pillar and a sidewall of the data line adjacent to the sidewall of the conductive pillar.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
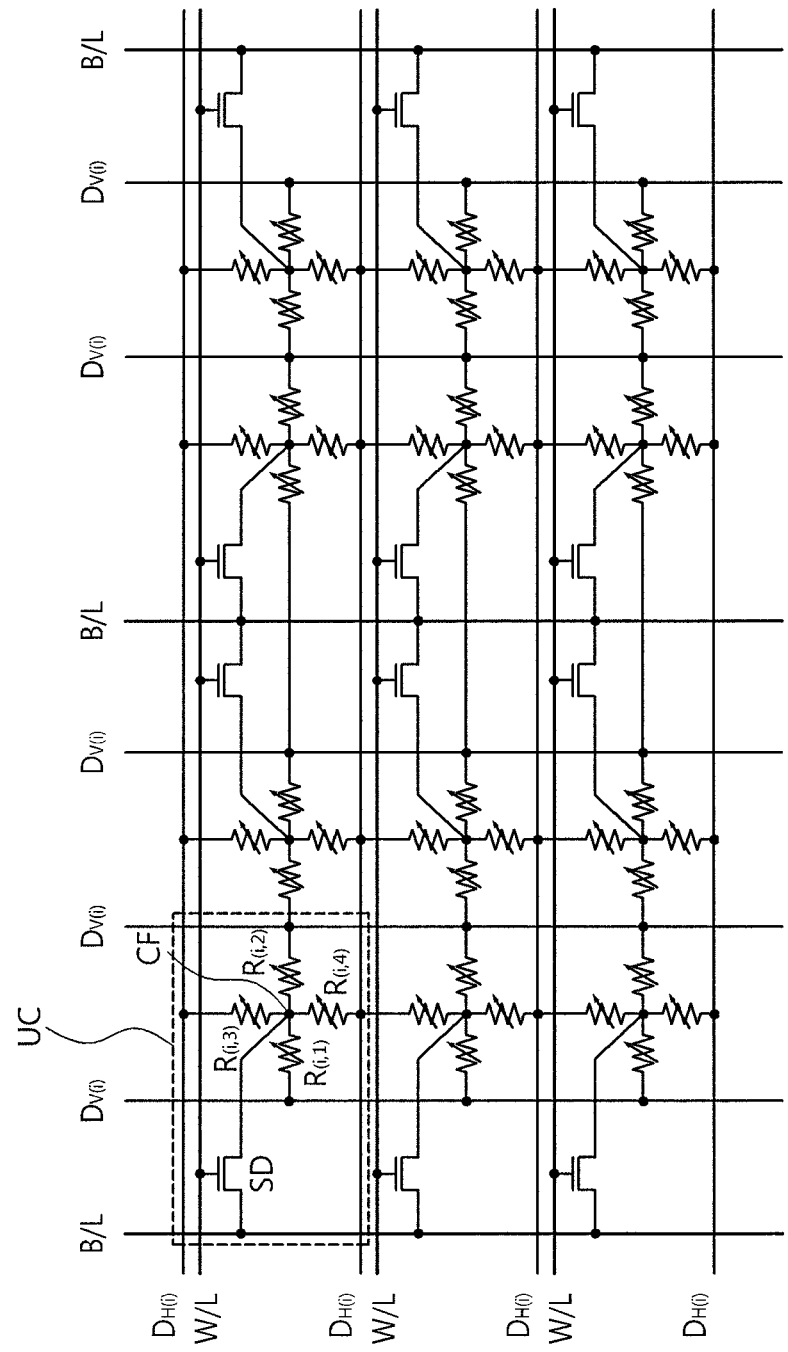
FIG. 1 is an equivalent circuit diagram showing a part of a resistance change memory device array in accordance with an exemplary embodiment of the present invention.

Hereinafter, exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the specification. In the specification, it will be understood that when a layer (or film) is referred to as being "on" another layer or substrate, it can be directly on the other layer or substrate, or a third layer may be interposed between the layer and the other layer or substrate.

FIG. 1 is an equivalent circuit diagram showing a part of a resistance change memory device array in accordance with an exemplary embodiment of the present invention.

Referring to FIG. 1, a resistance change memory device array includes a plurality of word lines W/L arranged parallel to each other and a plurality of bit lines B/L crossing the word lines W/L. Each of a plurality of unit cells UC is disposed at each cross point of the bit lines B/L and the word lines W/L.

One ends of unit memory devices $R_{(i,1)}$, $R_{(i,2)}$, $R_{(i,3)}$, and $R_{(i,4)}$ provided in the unit cells UC may be tied to a node, and the node may be a common electrode CF. The other ends of the unit memory devices $R_{(i,1)}$, $R_{(i,2)}$, $R_{(i,3)}$, and $R_{(i,4)}$ provided in the unit cells UC may be connected to a pair of first directional data lines $D_{V(i)}$ and a pair of second directional data lines $D_{H(i)}$, respectively. The first directional data lines $D_{V(i)}$ and the second directional data lines $D_{H(i)}$ may be disposed to cross each other.

The common electrode CF may be in the form of a conductive pillar. The first directional data lines $D_{V(i)}$ and the second directional data lines $D_{H(i)}$ may constitute an i-th unit layer, in which i may be an integer of 2 or higher, and in this case, the unit memory devices $R_{(i,1)}$, $R_{(i,2)}$, $R_{(i,3)}$, and $R_{(i,4)}$ provided in the unit cells UC may also be stacked in i number of layers.

In FIG. 1, two pairs of unit memory devices $R_{(i,1)}$, $R_{(i,2)}$, $R_{(i,3)}$, and $R_{(i,4)}$ provided in the unit cells UC are illustratively shown. However, the present invention is not limited thereto, and each unit cell UC may include a pair of unit memory cells such as $R_{(i,1)}$ and $R_{(i,2)}$, for example. As an example, if the unit memory devices $R_{(i,1)}$, $R_{(i,2)}$, $R_{(i,3)}$, and $R_{(i,4)}$ are stacked in i number of layers, each unit cell UC may include 4i number of unit memory devices.

A selection device SD may be a transistor. In this case, a gate of the selection device SD is electrically connected to the word line W/L. Any one of source and drain of the selection device SD is electrically connected to the bit line B/L, and the other is electrically connected to the common electrode CF.

Figure 2:
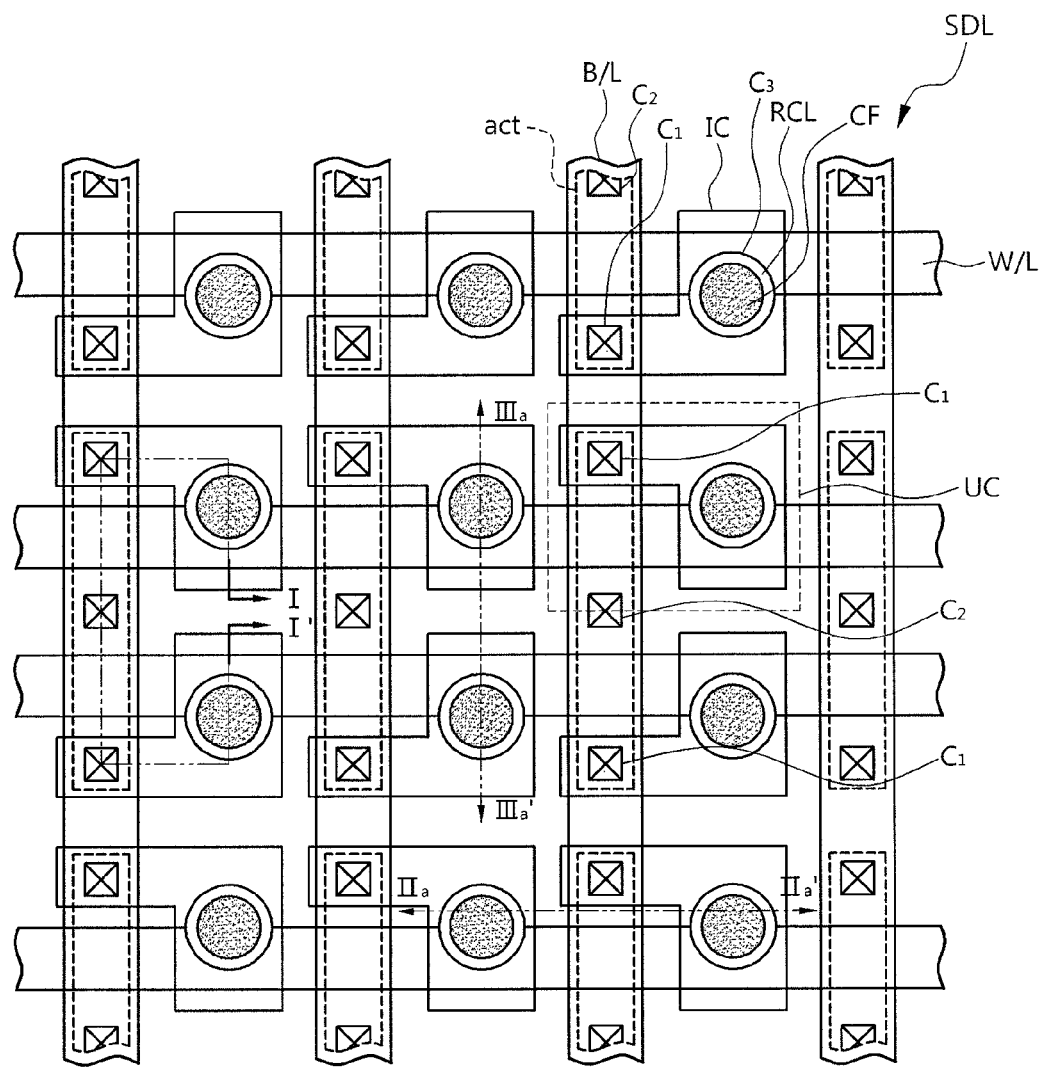
FIG. 2 is a layout diagram corresponding to the equivalent circuit diagram of FIG. 1 and showing a selection device layer of the resistance change memory device array in accordance with an exemplary embodiment of the present invention.
Figure 3:
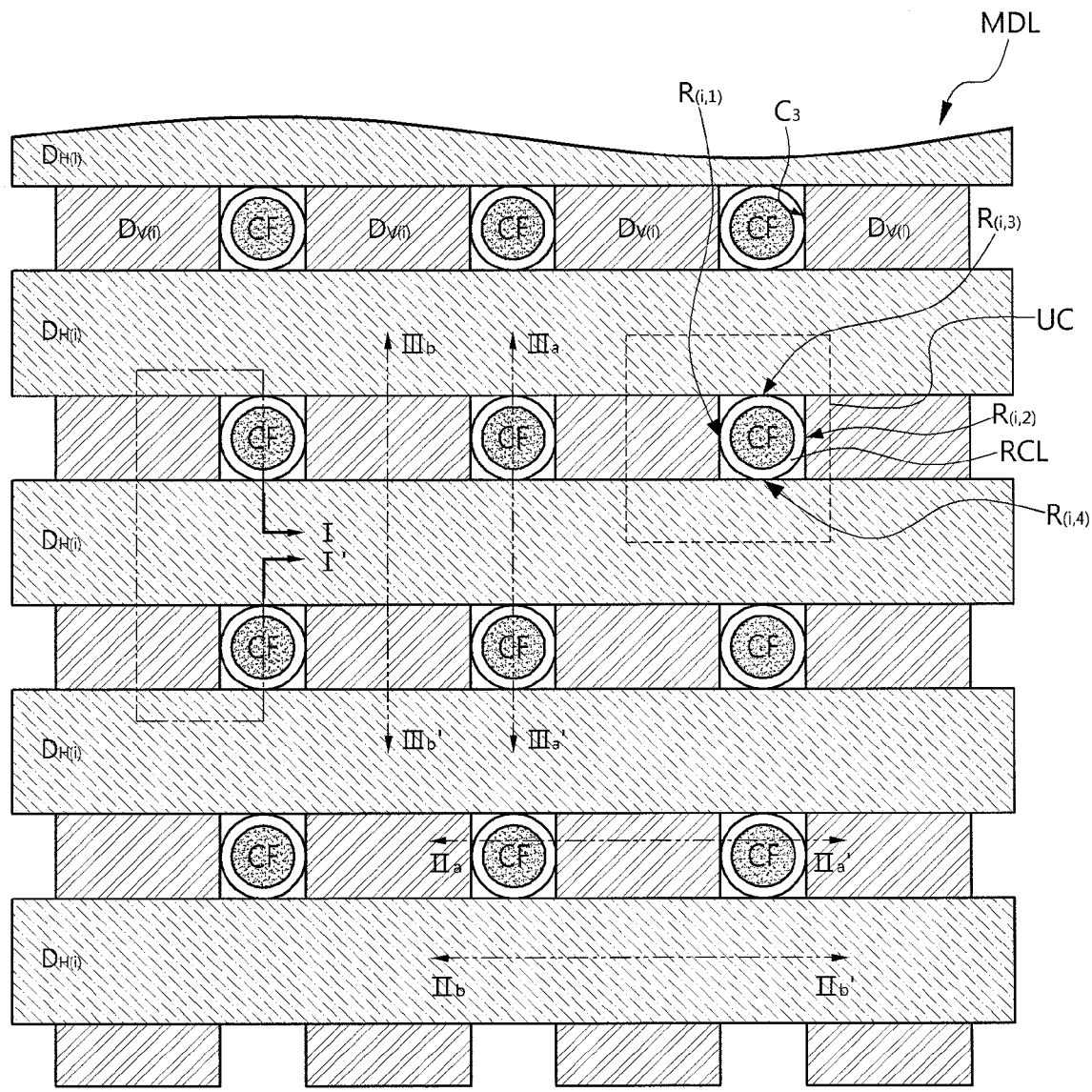
FIG. 3 is a layout diagram corresponding to the equivalent circuit diagram of FIG. 1 and showing a memory device layer of the resistance change memory device array in accordance with an exemplary embodiment of the present invention.
Figure 4:
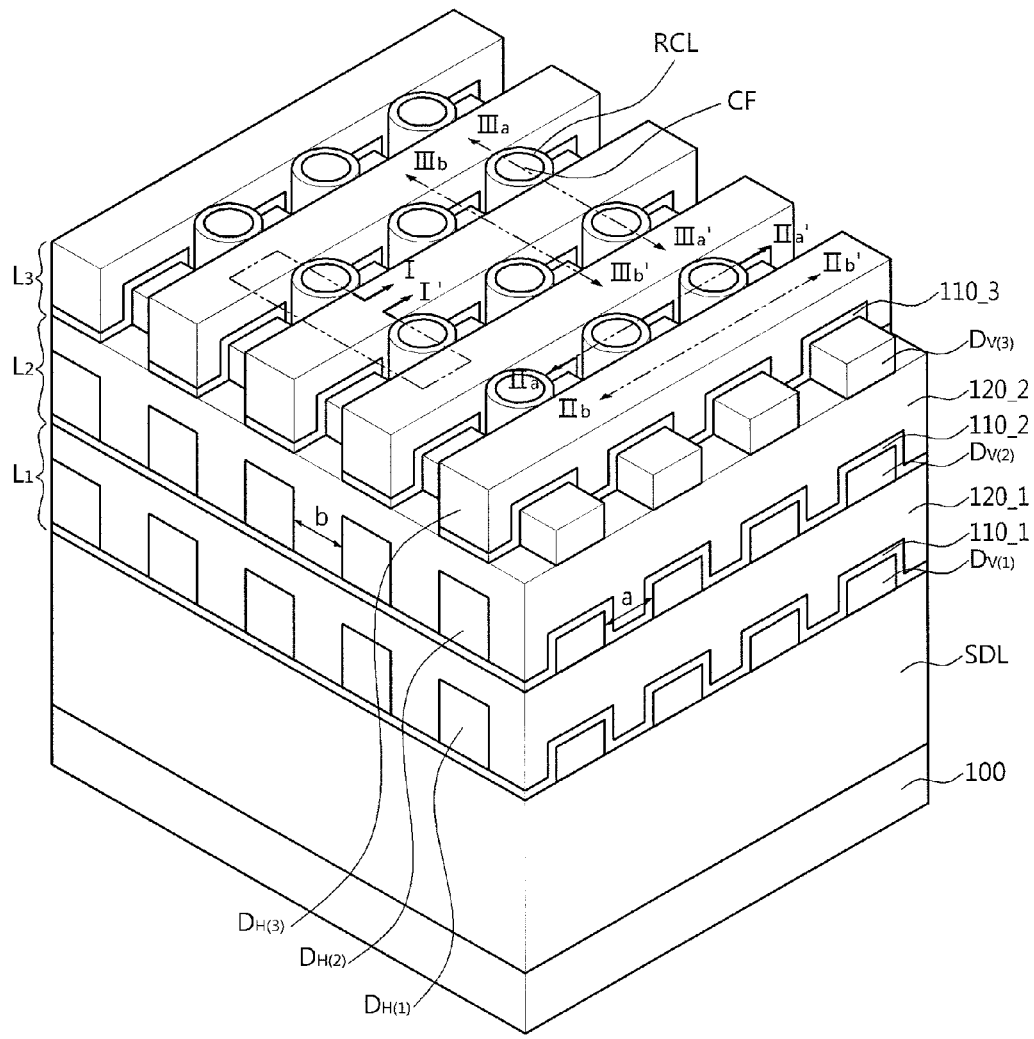
FIG. 4 is a perspective view showing the resistance change memory device array in accordance with an exemplary embodiment of the present invention.
Figure 5:
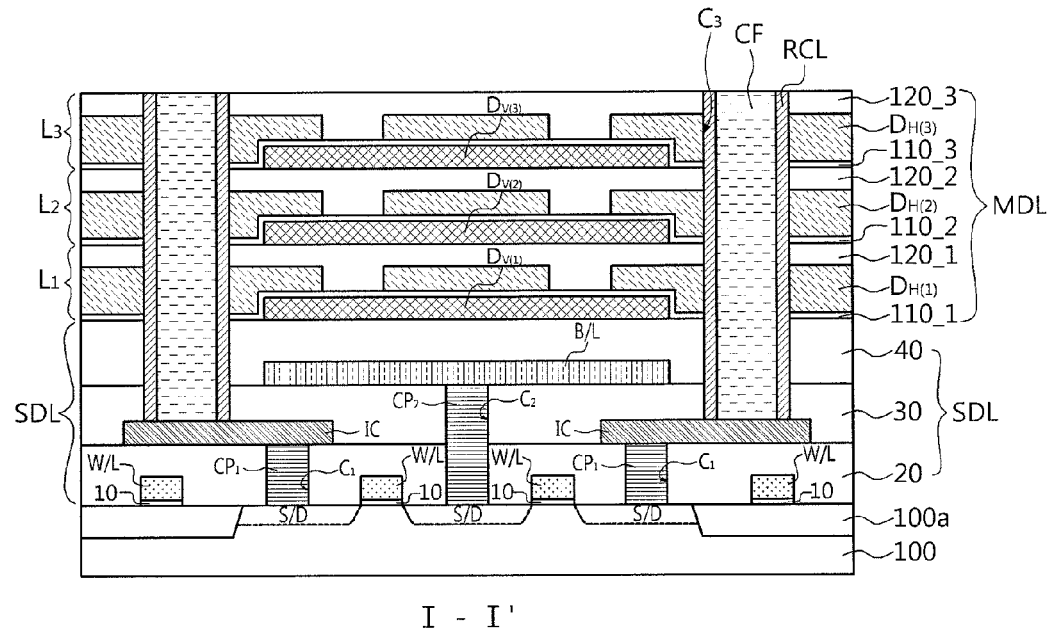
FIG. 5 is a cross-sectional view taken along line I-I' of FIGS. 2 to 4.

FIG. 2 is a layout diagram corresponding to the equivalent circuit diagram of FIG. 1 and showing a selection device layer SDL of the resistance change memory device array in accordance with an exemplary embodiment of the present invention, FIG. 3 is a layout diagram corresponding to the equivalent circuit diagram of FIG. 1 and showing a memory device layer MDL of the resistance change memory device array in accordance with an exemplary embodiment of the present invention, FIG. 4 is a perspective view showing the resistance change memory device array in accordance with an exemplary embodiment of the present invention, FIG. 5 is a cross-sectional view taken along line I-I' of FIGS. 2 to 4, and FIG. 6 is cross-sectional views taken along lines $II_a$-$II_a$' and $III_a$-$III_a$' of FIGS. 2 to 4.

Figure 6:
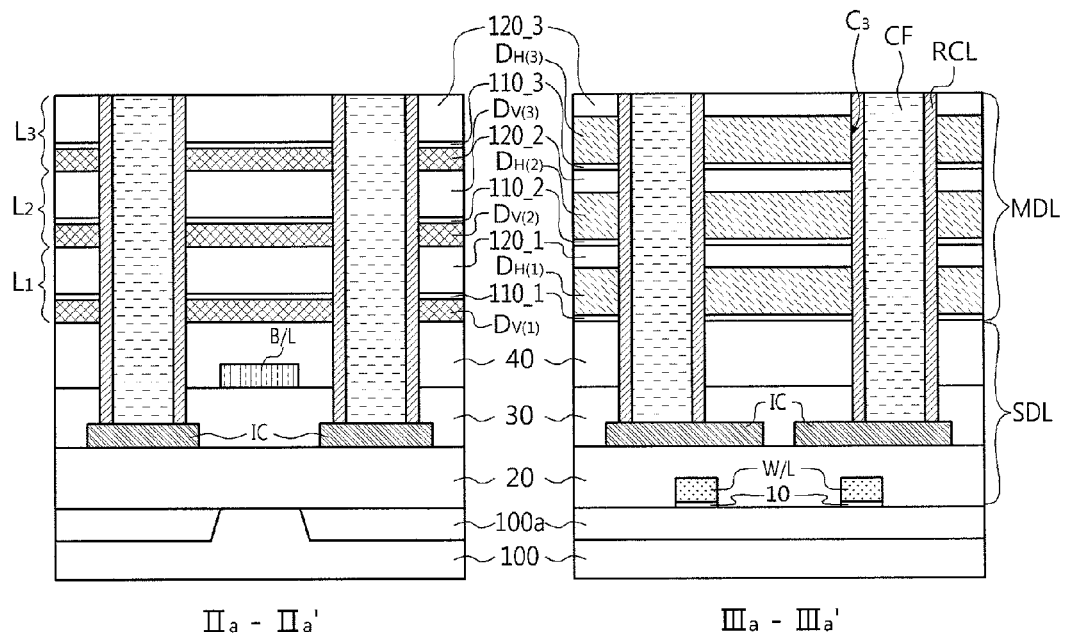
FIG. 6 is cross-sectional views taken along lines $II_a$-$II_a$' and $III_a$-$III_a$' of FIGS. 2 to 4.

Referring to FIGS. 2, 5 and 6, a device isolation film 100a may be formed on a substrate 100 to define active areas act. The active areas act may be formed parallel to each other in one direction, and each row of the active areas may comprise a plurality of active areas act. The substrate 100 may be a semiconductor substrate, and the device isolation film 100a may be formed by shallow trench isolation (STI).

Gate insulating films 10 and gate conductive films may be sequentially formed on the substrate 100 including the device isolation film 100a, and then the gate conductive films may be patterned, thereby forming the word lines W/L. Here, a pair of word lines W/L may cross the top of each active area act. Source/drain areas S/D may be formed by doping conductive impurities in the active area act using the word line W/L as a mask.

A first interlayer insulating film 20 is formed on the word lines W/L, and then first contact holes $C_1$ are formed in the first interlayer insulating film 20. Each pair of the first contact holes $C_1$ exposes both ends of each active area act, respectively. First contact plugs $CP_1$ may be formed by filling a conductive material in the first contact holes $C_1$.

Subsequently, interconnection patterns IC, each connected to the first contact plugs $CP_1$, may be formed on the first interlayer insulating film 20.

A second interlayer insulating film 30 may be formed on the interconnection patterns IC. Second contact holes $C_2$ may be formed in the second interlayer insulating film 30 and the first interlayer insulating film 20. Each of the second contact holes $C_2$ exposes the active area act between the pair of the word lines W/L. Second contact plugs $CP_2$ may be formed by filling a conductive material in the second contact holes $C_2$. Then, bit lines B/L connected to the second contact plugs $CP_2$ may be formed on the second interlayer insulating film 30. The bit lines B/L may be formed parallel to the rows of the active areas act.

A third interlayer insulating film 40 may be formed on the bit lines B/L.

Referring to FIGS. 3 to 6, a plurality of first directional data lines $D_{V(i)}$ (i=1) are disposed on the third interlayer insulating film 40. The first directional data lines $D_{V(i)}$ (i=1) may be disposed parallel to each other. A first interwire insulating film 110_i (i=1) may be disposed on the first directional data lines $D_{V(i)}$ (i=1).

A plurality of second directional data lines $D_{H(i)}$ (i=1), crossing the first directional data lines $D_{V(i)}$ (i=1) and arranged parallel to each other, may be positioned on the first interwire insulating film 110_i (i=1). A second interwire insulating film 120_i (i=1) may be disposed on the second directional data lines $D_{H(i)}$ (i=1).

The first directional data lines $D_{V(i)}$ (i=1), the first interwire insulating film 110_i (i=1), the second directional data lines $D_{H(i)}$ (i=1), and the second interwire insulating film 120_i (i=1) may constitute a first unit layer $L_i$ (i=1).

The unit layer may be stacked in plural layers. For example, as shown in FIGS. 4 to 6, a second unit layer $L_2$ ($L_i$, i=2) may be formed on the first unit layer $L_1$ ($L_i$, i=1), and a third unit layer $L_3$ ($L_i$, i=3) may be formed on the second unit layer $L_2$ ($L_i$, i=2).

The first directional data lines $D_{V(i)}$ ($D_{V(1)}$, $D_{V(2)}$, and $D_{V(3)}$) provided on the respective unit layers may be arranged parallel to each other, and the second directional data lines $D_{H(i)}$ ($D_{H(1)}$, $D_{H(2)}$, and $D_{H(3)}$) provided on the respective unit layers may also be arranged parallel to each other.

Each of third contact holes $C_3$ may be formed in a space surrounded by sidewalls facing each other of the first directional data lines $D_{V(i)}$) and sidewalls facing each other of the second directional data lines $D_{H(i)}$. A sidewall portion of each of the third contact holes $C_3$ may expose the sidewalls facing each other of the first directional data lines $D_{V(i)}$ and the sidewalls facing each other of the second directional data lines $D_{H(i)}$ and a bottom portion thereof may expose the interconnection pattern IC.

Conductive pillars CF are disposed in the third contact holes $C_3$, respectively. A resistance change material layer RCL is positioned between the sidewall of the conductive pillar and the sidewall of the data line adjacent thereto, for example, between the sidewall of the conductive pillar CF, the sidewalls of the first directional data lines $D_{V(i)}$ adjacent thereto, and the sidewalls of the second directional data lines $D_{H(i)}$. The resistance change material layer RCL may surround the circumference of the conductive filer CF.

In the present exemplary embodiment, each of the unit memory devices $R_{(i,1)}$, $R_{(i,2)}$, $R_{(i,3)}$ and $R_{(i,4)}$ includes a single conductive filer CF, a single data line $D_{H(i)}$ or $D_{V(i)}$ overlapping the sidewall of the conductive pillar CF, and the resistance change material layer RCL positioned between the sidewall of the conductive pillar CF and the data line $D_{H(i)}$ or $D_{V(i)}$. A conductive path may be formed (in a low resistance state) or cut off (in a high resistance state) in the resistance change material layer RCL by a difference in voltage between the conductive pillar CF and the data line $D_{H(i)}$ or $D_{V(i)}$. Such a conductive path is formed in an extremely small area in which the conductive pillar CF and the data line $D_{H(i)}$ or $D_{V(i)}$ overlap each other. Thus, even if the plurality of unit memory devices $R_{(i,1)}$, $R_{(i,2)}$, $R_{(i,3)}$ and $R_{(i,4)}$ share the single conductive pillar CF as an electrode, it is possible to write separate data in each of the unit memory devices $R_{(i,1)}$, $R_{(i,2)}$, $R_{(i,3)}$ and $R_{(i,4)}$ and read the written data without confusing them.

If only one unit layer is stacked, a pair of unit memory devices $R_{(i,1)}$, $R_{(i,2)}$, $R_{(i,3)}$ and $R_{(i,4)}$ may be formed in the unit cell UC, thereby increasing the degree of integration of the resistance change memory device. However, each unit layer may comprise the first directional data lines $D_{V(i)}$ (i=1) and the first interwire insulating film 110_i (i=1) other than the second directional data lines $D_{H(i)}$ (i=1) and the second interwire 120_i (i=1). In this case, a pair of unit devices $R_{(i,1)}$ and $R_{(i,2)}$ may be formed in the unit cell UC. Also, the degree of integration of the resistance change memory device can be increased more than the case where a single unit device is formed in the unit cell UC.

Moreover, if the unit layer is formed in i number of layers, the degree of integration of the device can be further increased.

The resistance change material layer RCL may surround the circumference of the conductive filer CF. The resistance change material layer RCL may be a metal oxide layer, a PCMO ($Pr_{1-x}Ca_xMnO_3$, 0<x<1) layer, a chalcogenide layer, a perovskite layer, or a metal-doped solid electrolyte layer. The metal oxide layer may be a $SiO_2$, $Al_2O_3$, or transition metal oxide layer. The transition metal oxide layer may be a $HfO_2$, $ZrO_2$, $Y_2O_3$, $TiO_2$, NiO, $Nb_2O_5$, $Ta_2O_5$, CuO, $Fe_2O_3$, or lanthanoide oxide layer. The lanthanoide may be lanthanum (La), cerium (Ce), praseodymium (Pr), neodymium (Nd), samarium (Sm), gadolinium (Gd), or dysprosium (Dy). The chalcogenide layer may be a GeSbTe layer, and the perovskite layer may be $SrTiO_3$, Cr or Nb-doped $SrZrO_3$ layer. Moreover, the metal-doped solid electrolyte layer may be an AgGeSe layer in which Ag is doped in GeSe.

A tunnel barrier insulating film (not shown) may be further positioned between the sidewall of the conductive pillar CF and the resistance change material layer RCL or between the resistance change material layer RCL and the data line $D_{H(i)}$ and/or $D_{V(i)}$. If an electric field applied to both ends of the tunnel barrier insulating film is higher than a predetermined voltage, the potential barrier is changed, and thus electrons can be tunneled through the tunnel barrier insulating film. In other words, if the electric field applied to both ends of the tunnel barrier insulating film is lower than the predetermined voltage, the electrons cannot be tunneled through the tunnel barrier insulating film. For example, the tunnel barrier insulating film may have a $SiO_2$, $Al_2O_3$, $HfO_2$ or multilayered $SiO_2$(2-nm)/$HfO_2$(3-nm) stack structure of about 2 to 5 nm in thickness. If such a tunnel barrier insulating film is formed, it is possible to minimize a leakage current that may flow in an unselected cell, to which an electric field lower than a predetermined voltage is applied.

Figure 7:
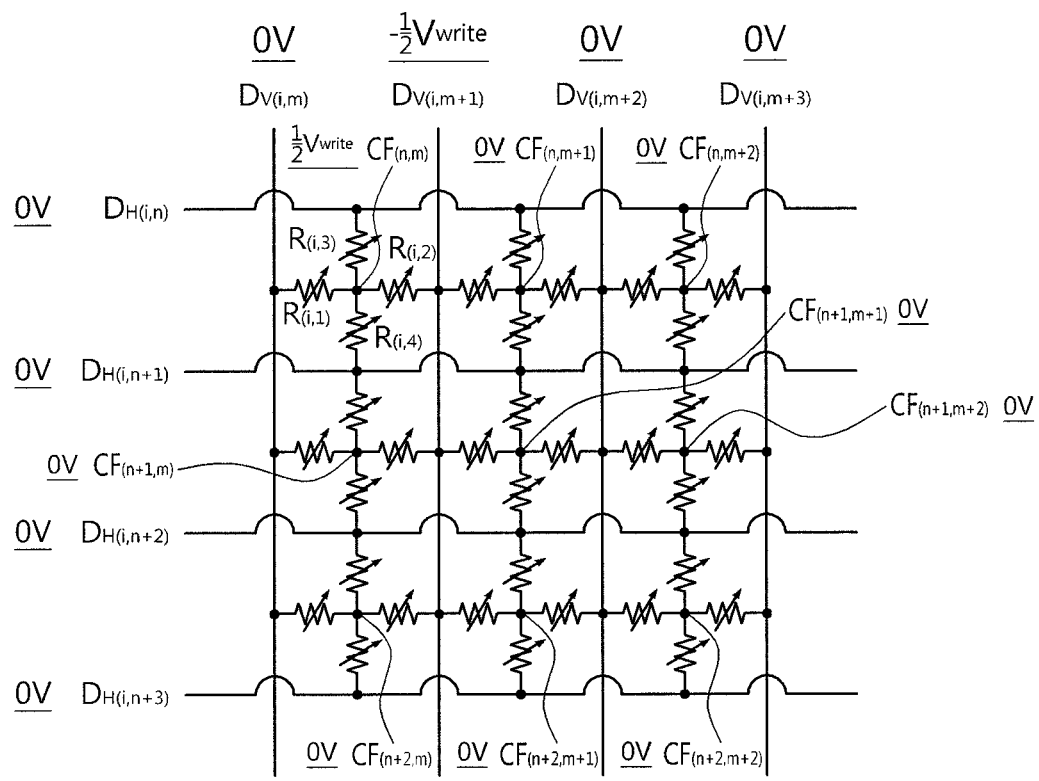
FIG. 7 is a schematic diagram showing an example of a programming operation of a resistance change memory device in accordance with an exemplary embodiment of the present invention.

FIG. 7 is a schematic diagram showing an example of a programming operation of a resistance change memory device in accordance with an exemplary embodiment of the present invention, from which the selection device SD is omitted.

Referring to FIG. 7, an electric field of $\frac{1}{2}V_{write}$ is applied to a selected conductive pillar $CF_{(n,m)}$, and a ground voltage 0V is applied to unselected conductive pillars $CF_{(n,m+1)}$, $CF_{(n,m+2)}$, $CF_{(n+1,m)}$, $CF_{(n+1,m+1)}$, $CF_{(n+1,m+2)}$, $CF_{(n+2,m)}$, $CF_{(n+2,m+1)}$ and $CF_{(n+2,m+2)}$. This may be implemented by selectively turning on a switching device (SD of FIG. 1) electrically connected to the selected conductive pillar and by selectively turning off switching devices (SD of FIG. 1) electrically connected to the unselected conductive pillars.

An electric field of $-\frac{1}{2}V_{write}$ is applied to a selected data line $D_{V(i,m+1)}$, and a ground voltage is applied to unselected data lines $D_{V(i,m)}$, $D_{V(i,m+2)}$, $D_{V(i,m+3)}$, $D_{H(i,n)}$, $D_{H(i,n+1)}$, $D_{H(i,n+2)}$ and $D_{H(i,n+3)}$. As a result, an electric field of $V_{write}$ is applied to a unit device between the selected conductive pillar $CF_{(n,m)}$ and the selected data line $D_{V(i,m+1)}$, that is, to a target device $R_{(i,2)}$, and thus data is programmed in the target device $R_{(i,2)}$ (in a low resistance state or in a high resistance state).

On the contrary, an electric field of $\frac{1}{2}V_{write}$ is applied to the unit devices $R_{(i,1)}$, $R_{(i,3)}$ and $R_{(i,4)}$ between the selected conductive pillar $CF_{(n,m)}$ and the unselected data lines $D_{V(i,m)}$, $D_{H(i,n)}$ and $D_{H(i,n+1)}$ and to the unit devices between the selected data line $D_{V(i,m+1)}$ and the unselected conductive pillars $CF_{(n,m+1)}$, $CF_{(n+1,m)}$, $CF_{(n+1,m+1)}$, $CF_{(n+2,m)}$ and $CF_{(n+2,m+1)}$, and thus data is not programmed. Moreover, an electric field is not applied to the unit devices other than the above-described unit devices, and thus data is not programmed.

As such, it can be seen that data can be selectively programmed in the target device of the resistance change memory device array in accordance with an exemplary embodiment of the present invention.

Figure 8:
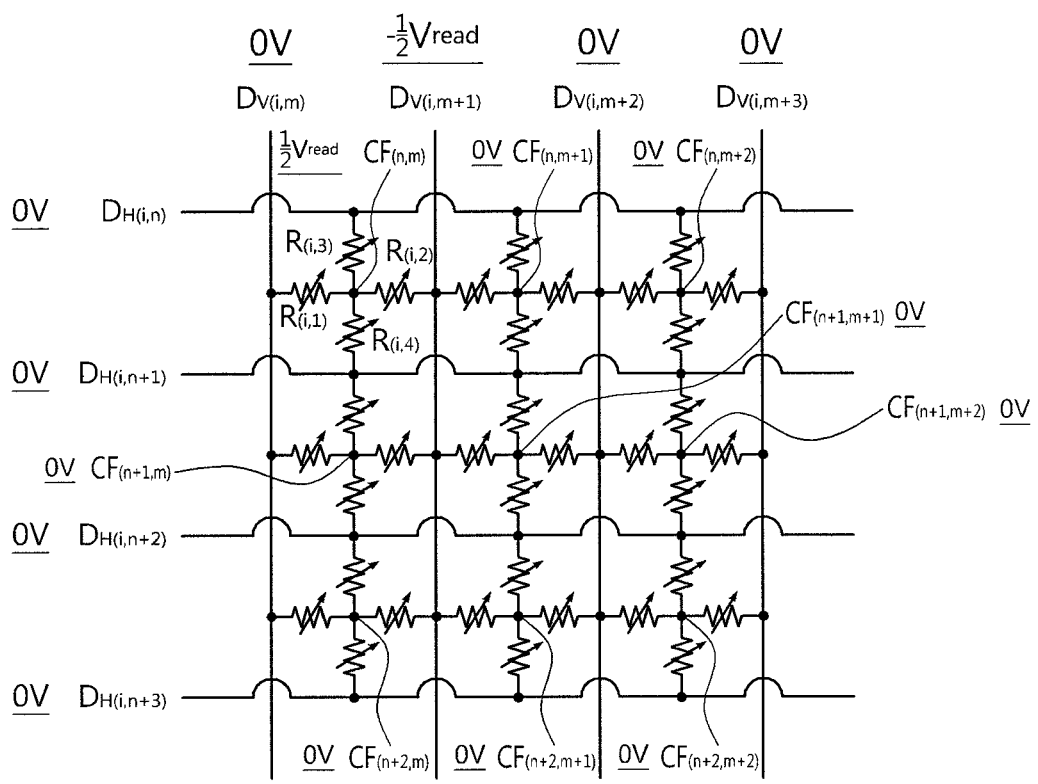
FIG. 8 is a schematic diagram showing an example of a reading operation of the resistance change memory device in accordance with an exemplary embodiment of the present invention.

FIG. 8 is a schematic diagram showing an example of a reading operation of the resistance change memory device in accordance with an exemplary embodiment of the present invention.

Referring to 8, an electric field of $\frac{1}{2}V_{read}$ is applied to a selected conductive pillar $CF_{(n,m)}$, and a ground voltage is applied to unselected conductive pillar $CF_{(n,m+1)}$, $CF_{(n,m+2)}$, $CF_{(n+1,m)}$, $CF_{(n+1,m+1)}$, $CF_{(n+1,m+2)}$, $CF_{(n+2,m)}$, $CF_{(n+2,m+1)}$ and $CF_{(n+2,m+2)}$. This may be implemented by selectively turning on a switching device (SD of FIG. 1) electrically connected to the selected conductive pillar and by selectively turning off switching devices (SD of FIG. 1) electrically connected to the unselected conductive pillars.

An electric field of $-\frac{1}{2}V_{read}$ is applied to a selected data line $D_{V(i,m+1)}$, and a ground voltage is applied to unselected data lines $D_{V(i,m)}$, $D_{V(i,m+2)}$, $D_{V(i,m+3)}$, $D_{H(i,n)}$, $D_{H(i,n+1)}$, $D_{H(i,n+2)}$ and $D_{H(i,n+3)}$. As a result, an electric field of $V_{read}$ is applied to a unit device between the selected conductive pillar $CF_{(n,m)}$ and the selected data line $D_{V(i,m+1)}$, that is, to a target device $R_{(i,2)}$, and thus a current corresponding to the data stored in the target device $R_{(i,2)}$ flows in the selected data line $D_{V(i,m+1)}$.

On the contrary, an electric field of $\frac{1}{2}V_{read}$ is applied to the unit devices $R_{(i,1)}$, $R_{(i,3)}$ and $R_{(i,4)}$ between the selected conductive pillar $CF_{(n,m)}$ and the unselected data lines $D_{V(i,m)}$, $D_{H(i,n)}$ and $D_{H(i,n+1)}$ and to the unit devices between the selected data line $D_{V(i,m+1)}$ and the unselected conductive pillars $CF_{(n,m+1)}$, $CF_{(n+1,m)}$, $CF_{(n+1,m+1)}$, $CF_{(n+2,m)}$ and $CF_{(n+2,m+2)}$. Moreover, an electric field is not applied to the unit memory devices other than the above-described unit memory devices.

Here, if the current of the selected data line $D_{V(i,m+1)}$ is sensed, it is possible to read the data stored in the target memory device $R_{(i,2)}$.

However, it is preferred that the current flowing in other unit memory devices connected to the selected data line $D_{V(i,m+1)}$ and applied with an electric field of $\frac{1}{2}V_{read}$ be about 100 times lower that that flowing in the target memory device $R_{(i,2)}$. To this end, as described with reference to FIGS. 3 to 6, the tunnel barrier insulating film may be applied to the unit memory devices. In detail, with the application of the tunnel barrier insulating film to the unit memory devices, if an electric field of $\frac{1}{2}V_{read}$ is applied, the current may not flow in the unit memory devices due to the potential barrier of the tunnel barrier insulating film. On the contrary, if an electric field of $V_{read}$ is applied, the current may flow in the unit memory devices due to the change in the potential barrier of the tunnel barrier insulating film. However, the present invention is not limited thereto. That is, the current flowing in the selected data line $D_{V(i,m+1)}$, i.e., a reference current, is measured by applying an electric field of $\frac{1}{2}V_{read}$ to all the unit memory devices including the target memory device connected to the selected data line $D_{V(i,m+1)}$, the current flowing in the selected data line $D_{V(i,m+1)}$, i.e., a read current, is measured by selectively applying an electric field of $V_{read}$ to the target memory device $R_{(i,2)}$ as mentioned above, and then the reference current and the read current are compared. In this case, it is possible to properly read the data stored in the target memory device $R_{(i,2)}$, even if the difference between the current measured when an electric field of $\frac{1}{2}V_{read}$ is applied and that measured when an electric field of $V_{read}$ is applied is not great.

Figure 9:
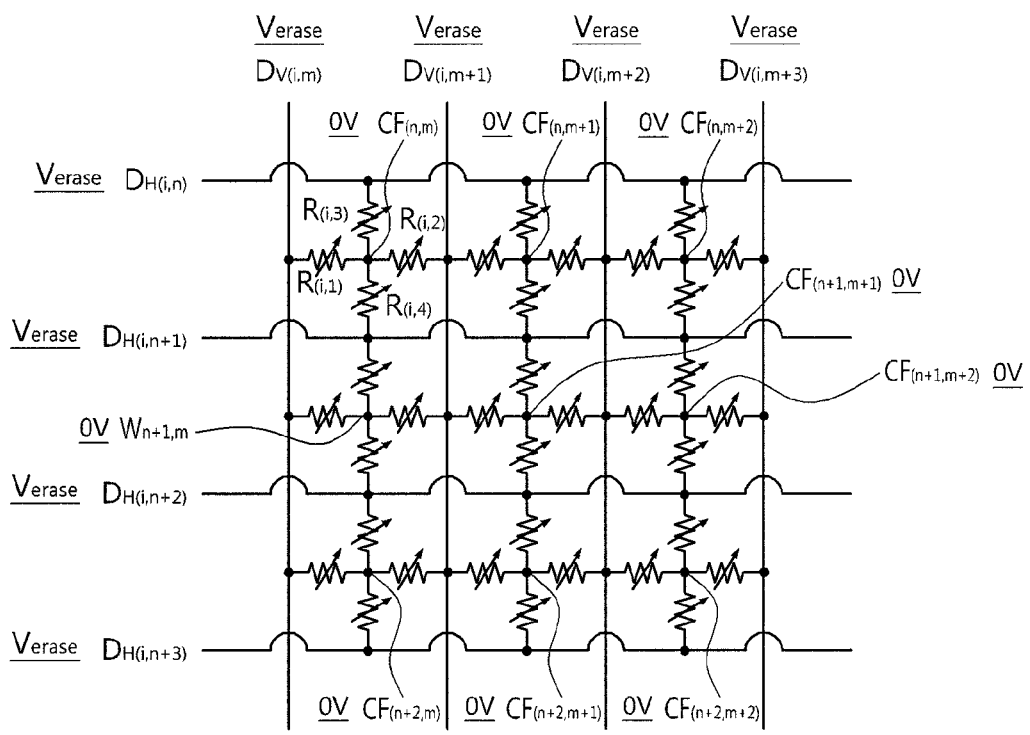
FIG. 9 is a schematic diagram showing an example of an erasing operation of the resistance change memory device in accordance with an exemplary embodiment of the present invention.

FIG. 9 is a schematic diagram showing an example of an erasing operation of the resistance change memory device in accordance with an exemplary embodiment of the present invention.

Referring to FIG. 9, when an electric field of $V_{erase}$ is applied to all the unit memory devices by applying a ground voltage to all the conductive pillars and applying the electric field of $V_{erase}$ to all signal lines, it is possible to erase the data written in all the unit memory devices. The application of the ground voltage to all the conductive pillars may be implemented by turning off the switching devices electrically connected to all the conductive pillars.

FIGS. 10 to 18 are cross-sectional views showing a memory device layer taken along lines $II_a$-$II_a'$, $II_b$-$II_b'$, $III_a$-$III_a'$, and $III_b$-$III_b'$ of FIGS. 3 and 4 for each process.

Figure 10:
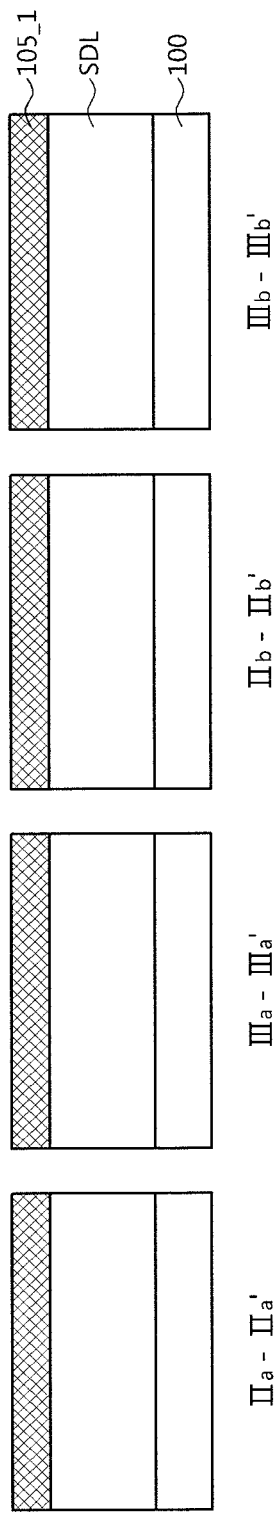
FIGS. 10 to 18 are cross-sectional views showing a memory device layer taken along lines $II_a$-$II_a$', $II_b$-$II_b$', $III_a$-$III_a$', and $III_b$-$III_b$' of FIG. 4 for each process.

Referring to FIGS. 3, 4 and 10, a substrate 100 is provided. A selection device layer SDL is formed on the substrate 100 as described with reference to FIGS. 2, 5 and 6.

A first data conductive film 105_$i$ ($i$=1) is formed on the selection device layer SDL. The first data conductive film 105_$i$ ($i$=1) may have a thickness of 1 F. The first data conductive film 105_$i$ ($i$=1) may be a Pt layer, a Ru layer, an Ir layer, or an Al layer, and preferably, the Al layer.

Figure 11:
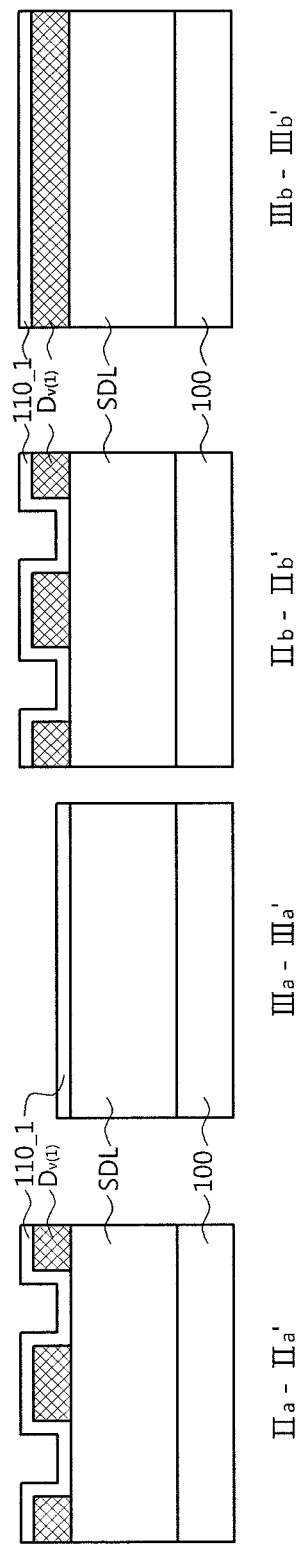

Referring to FIGS. 3, 4 and 11, a plurality of first directional data lines $D_{V(i)}$ ($i$=1) arranged parallel to each other may be formed by pattering the first data conductive film 105_$i$ ($i$=1) by a photographic process. The pitch between the first directional data lines $D_{V(i)}$ ($i$=1) may be 2 F (F: feature size).

An interwire insulating film 110_$i$ ($i$=1) may be formed on the first directional data lines $D_{V(i)}$ ($i$=1). The first interwire insulating film 110_$i$ ($i$=1) may be formed to conformally cover the first directional data lines $D_{V(i)}$ ($i$=1). Moreover, the first interwire insulating film 110_$i$ ($i$=1) may have a thickness of about F/5, for example, so as not to fill the space between the first directional data lines $D_{V(i)}$ ($i$=1). The first interwire insulating film 110_$i$ ($i$=1) may be a silicon oxide layer.

Figure 12:
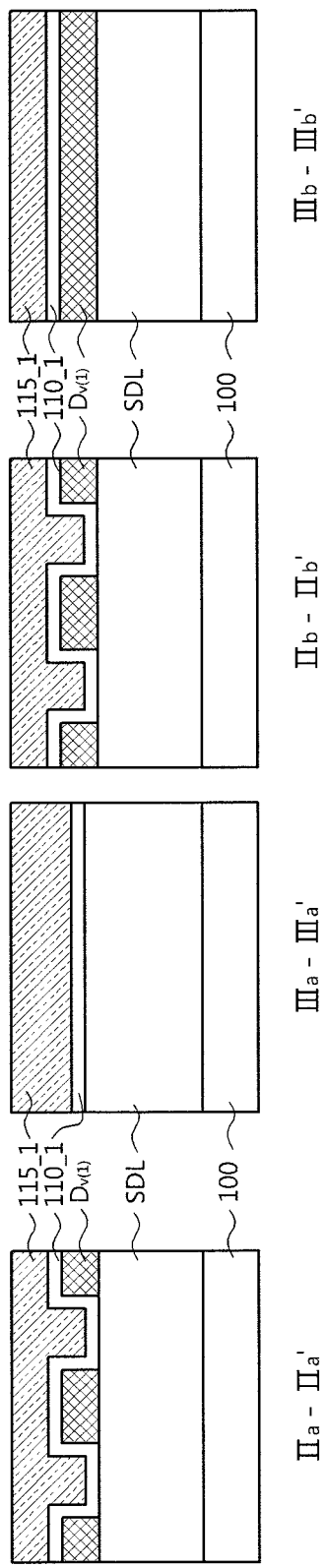

Referring to FIGS. 3, 4 and 12, a second data conductive film 115_$i$ ($i$=1) may be formed on the first interwire insulating film 110_$i$ ($i$=1). The second data conductive film 115_$i$ ($i$=1) may have a thickness of 2 F so as to fill the space between the first directional data lines $D_{V(i)}$ ($i$=1). The second data conductive film 115_$i$ ($i$=1) may be a Pt layer, a Ru layer, an Ir layer, or an Al layer, and preferably, the Al layer.

Subsequently, the second data conductive film 115_$i$ ($i$=1) may be planarized by chemical mechanical polishing (CMP).

Figure 13:
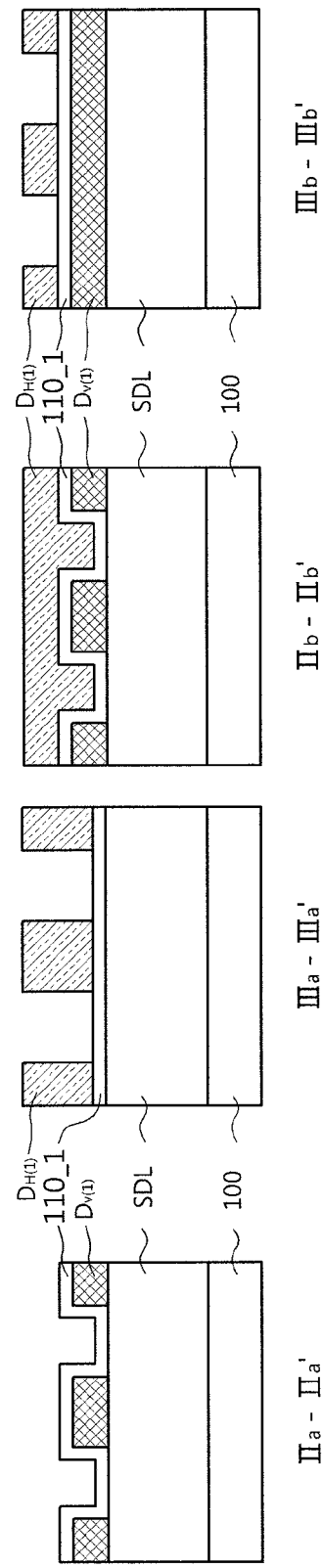

Referring to FIGS. 3, 4 and 13, a plurality of second directional data lines $D_{H(i)}$ ($i$=1) arranged parallel to each other may be formed by pattering the second data conductive film 115_$i$ ($i$=1) by a photographic process. The second directional data lines $D_{H(i)}$ ($i$=1) may cross the first directional data lines $D_{V(i)}$ ($i$=1) and be arranged parallel to each other. The pitch between of the second directional data lines $D_{H(i)}$ ($i$=1) may be 2 F (F: feature size).

Figure 14:
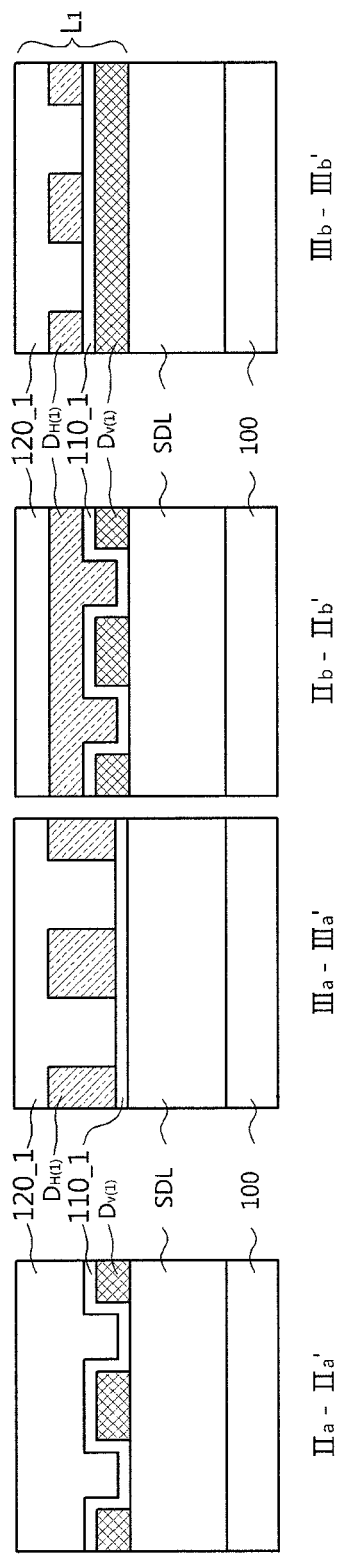

Referring to FIGS. 3, 4 and 14, a second interwire insulating film 120_$i$ ($i$=1) may be formed on the second directional data lines $D_{H(i)}$ ($i$=1) to cover them. The second interwire insulating film 120_$i$ ($i$=1) may have a thickness of 2 F, for example, so as to sufficiently fill the space between the second directional data lines $D_{H(i)}$ ($i$=1). The second interwire insulating film 120_$i$ ($i$=1) may be a silicon oxide layer. The second interwire insulating film 120_$i$ ($i$=1) may be planarized by CMP.

The first directional data lines $D_{V(i)}$ ($i$=1), the first interwire insulating film 110_$i$ ($i$=1), the second directional data lines $D_{H(i)}$ ($i$=1), and the second interwire insulating film 120_$i$ ($i$=1) may constitute the first unit layer $L_i$ ($i$=1). However, each unit layer may comprise the first directional data lines $D_{V(i)}$ ($i$=1) and the first interwire insulating film 110_$i$ ($i$=1) other than the second directional data lines $D_{H(i)}$ ($i$=1) and the second interwire 120_$i$ ($i$=1).

Figure 15:
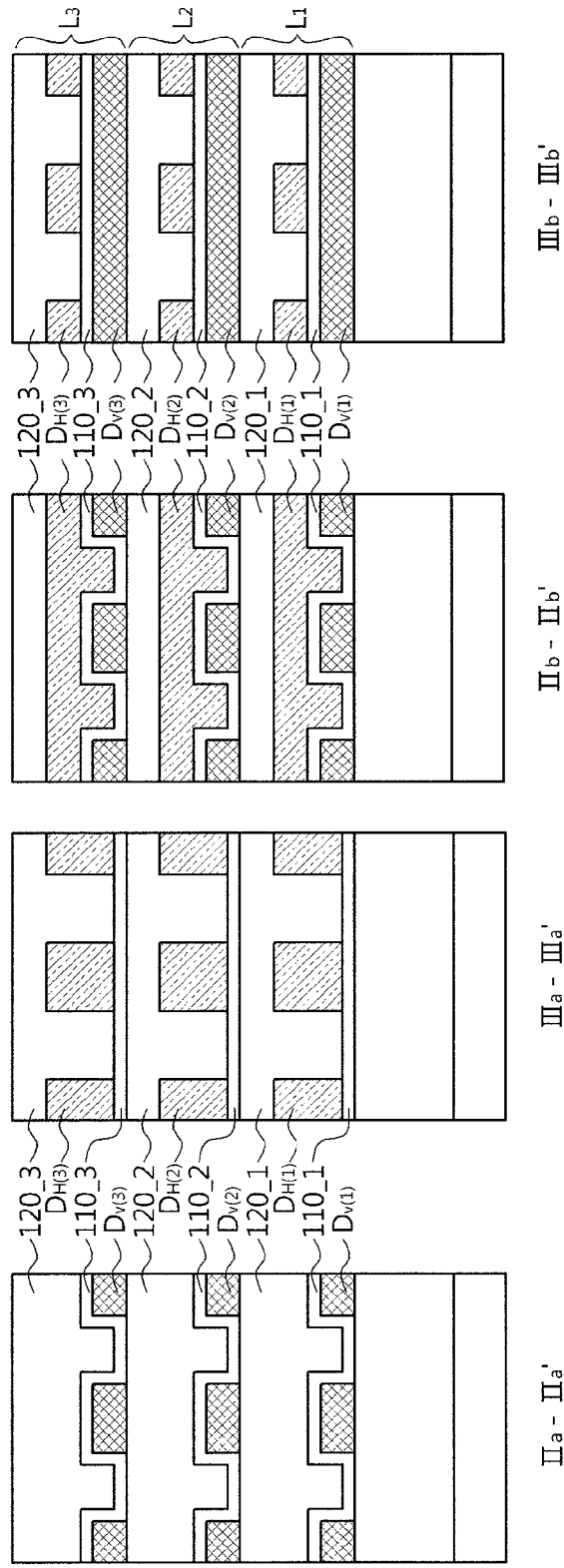

Referring to FIGS. 3, 4 and 15, a plurality of unit layers may be stacked. As an example, a second unit layer $L_2$ ($L_i$, $i$=2) may be formed on the first unit layer $L_1$ ($L_i$, $i$=1), and a third unit layer $L_3$ ($L_i$, $i$=3) may be formed on the second unit layer $L_2$ ($L_i$, $i$=2).

Figure 16:
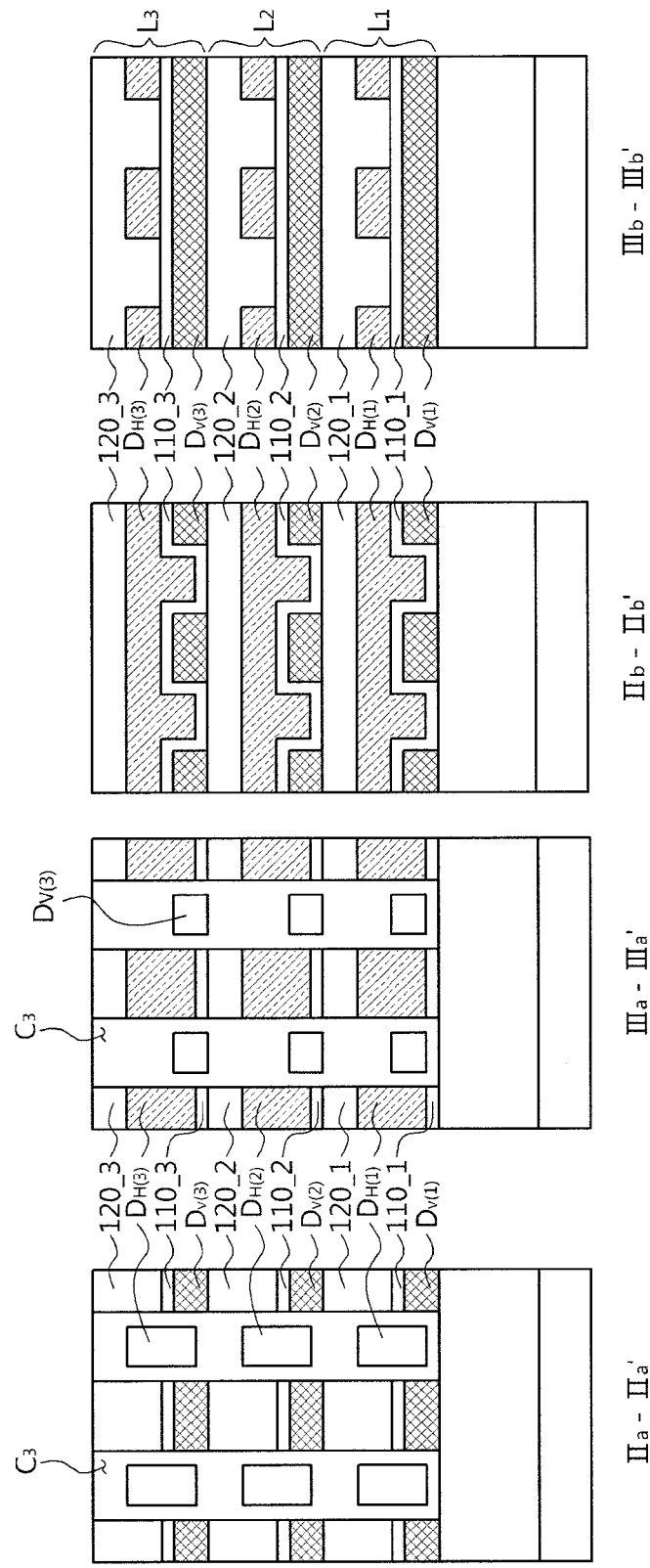

Referring to FIGS. 3, 4 and 16, a plurality of contact holes $C_3$ may be formed in the second interwire insulating film 120_$i$ ($i$=1, 2 or 3) and the first interwire insulating film 110_$i$ ($i$=1, 2 or 3). The contact holes $C_3$ are formed in spaces surrounded by sidewalls facing each other of the first directional data lines $D_{V(i)}$ and sidewalls facing each other of the second directional data lines $D_{H(i)}$ such that a sidewall portion thereof can expose the sidewalls facing each other of the first directional data lines $D_{V(i)}$ and the sidewalls facing each other of the second directional data lines $D_{H(i)}$. The contact holes $C_3$ may extend up to the inside of the interlayer insulating films (denoted by reference numerals 30 and 40 in FIGS. 4 and 5) of the switching device SDL such that a bottom portion thereof can expose the interconnection pattern (denoted by reference numeral IC in FIGS. 4 and 5.

The diameter of the contact hole $C_3$ can satisfy the following formula 1.

$$\max(a,b) \leq DM_H < \sqrt{a^2+b^2} \qquad \text{[Formula 1]}$$

In formula 1, $DM_H$ represents the diameter of the contact hole $C_3$, a represents the interval between adjacent first directional data lines $D_{V(i)}$, and b represents the interval between adjacent second directional data lines $D_{H(i)}$.

If the diameter of the contact hole $C_3$ satisfies the above formula 1, the sidewalls facing each other of the first directional data lines $D_{V(i)}$ and the sidewalls facing each other of the second directional data lines $D_{H(i)}$ may be exposed through each of the contact holes $C_3$. Moreover, a part of the insulating film remains between a corner where the first directional data lines $D_{V(i)}$ and the second directional data lines $D_{H(i)}$ meet each other and the contact hole $C_3$ such that the first directional data lines $D_{V(i)}$ and the second directional data lines $D_{H(i)}$ may not be short circuited to each other.

Figure 17:
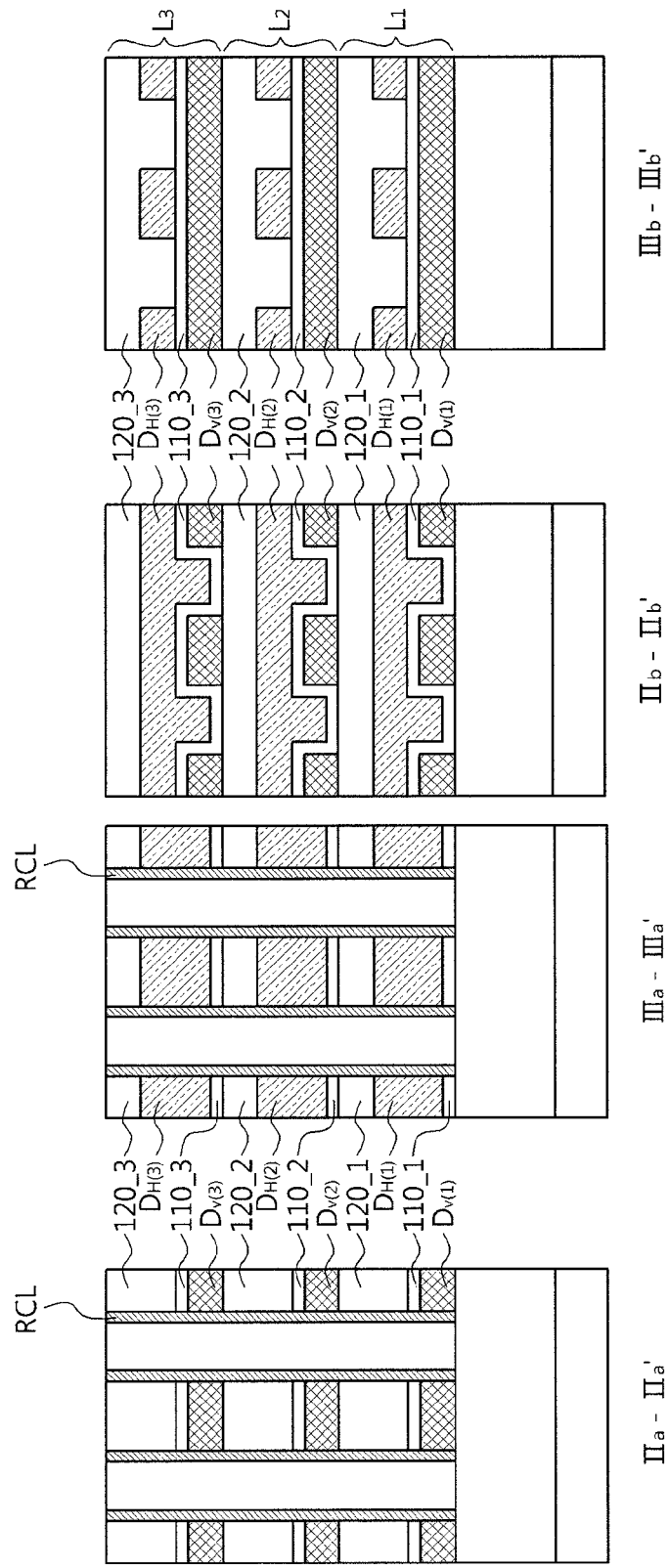

Referring to FIGS. 4 and 17, a resistance change material layer RCL, which conformally covers the sidewall of the contact hole $C_3$, may be formed in the contact hole $C_3$. As a result, the resistance change material layer RCL can cover the sidewalls facing each other of the first directional data lines $D_{V(i)}$ and the sidewalls facing each other of the second directional data lines $D_{H(i)}$.

The resistance change material layer RCL may be a metal oxide layer, a PCMO ($Pr_{1-x}Ca_xMnO_3$, 0<x<1) layer, a chalcogenide layer, a perovskite layer, or a metal-doped solid electrolyte layer. The metal oxide layer may be a $SiO_2$, $Al_2O_3$, or transition metal oxide layer. The transition metal oxide layer may be a $HfO_2$, $ZrO_2$, $Y_2O_3$, $TiO_2$, NiO, $Nb_2O_5$, $Ta_2O_5$, CuO, $Fe_2O_3$, or lanthanoide oxide layer. The lanthanoide may be lanthanum (La), cerium (Ce), praseodymium (Pr), neodymium (Nd), samarium (Sm), gadolinium (Gd), or dysprosium (Dy). The chalcogenide layer may be a GeSbTe layer, and the perovskite layer may be $SrTiO_3$, Cr or Nb-doped $SrZrO_3$ layer. Moreover, the metal-doped solid electrolyte layer may be an AgGeSe layer in which Ag is doped in GeSe.

The resistance change material layer RCL may be formed by physical vapor deposition (PVD) such as pulsed laser deposition (PLD), thermal evaporation, electron-beam evaporation, etc., molecular beam epitaxy (MBE), or chemical vapor deposition (CVD).

Figure 18:
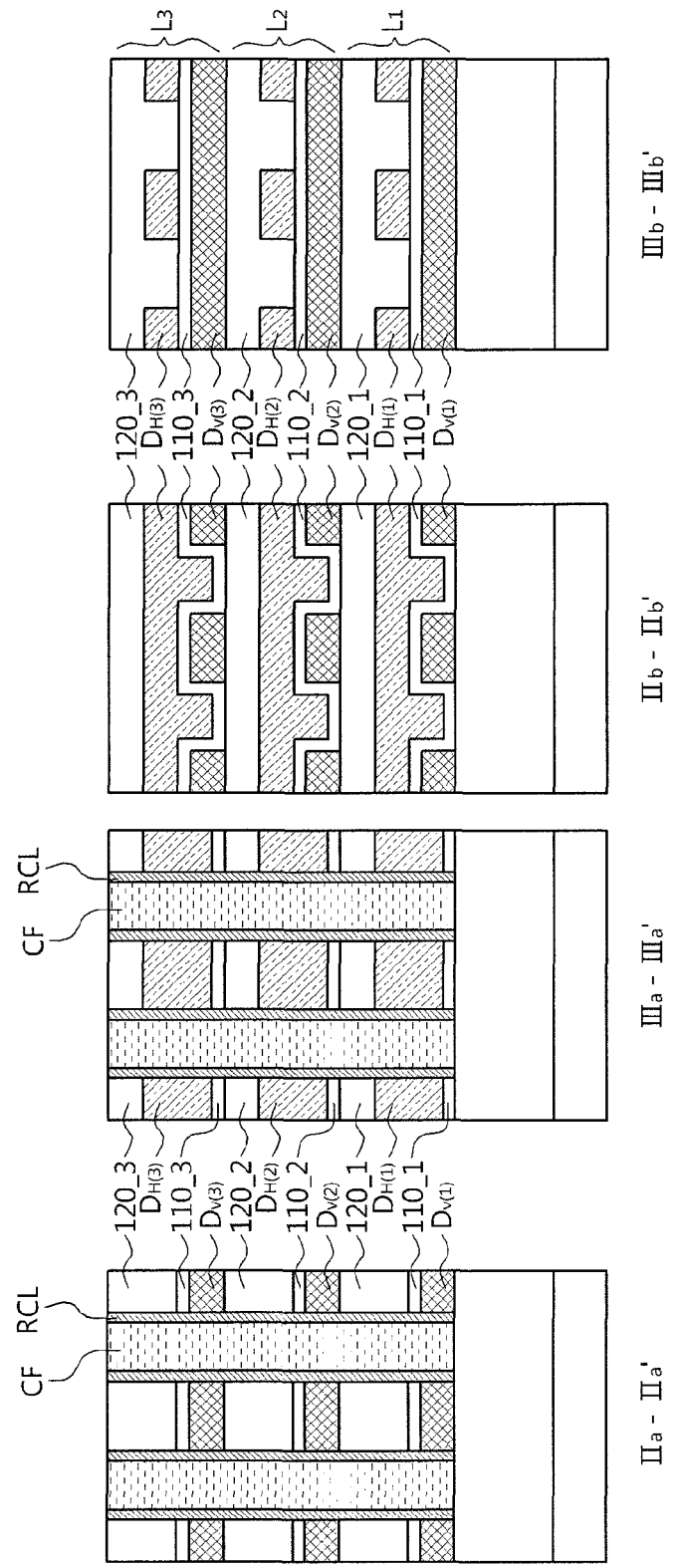

Referring to FIGS. 3, 4 and 18, a plurality of conductive pillars CF are disposed in the contact holes $C_3$ surrounded by the resistance change material layer RCL, respectively. As a result, the resistance change material layer RCL is positioned between both sidewalls of each conductive pillar CF and a pair of first directional data lines $D_{V(i)}$ and between the opposite sidewalls of each conductive pillar CF and a pair of second directional data lines $D_{H(i)}$.

A tunnel barrier insulating film (not shown) covering the sidewalls of the data lines $D_{V(i)}$ and $D_{H(i)}$ may be formed in the contact hole $C_3$ before forming the resistance change material layer RCL. Otherwise, a tunnel barrier insulating film may be formed on the resistance change material layer RCL before forming the conductive pillar CF. However, the tunnel barrier insulating film may be formed before forming the resistance change material layer RCL in view of stability of the resistance change material layer RCL.

Figure 19:
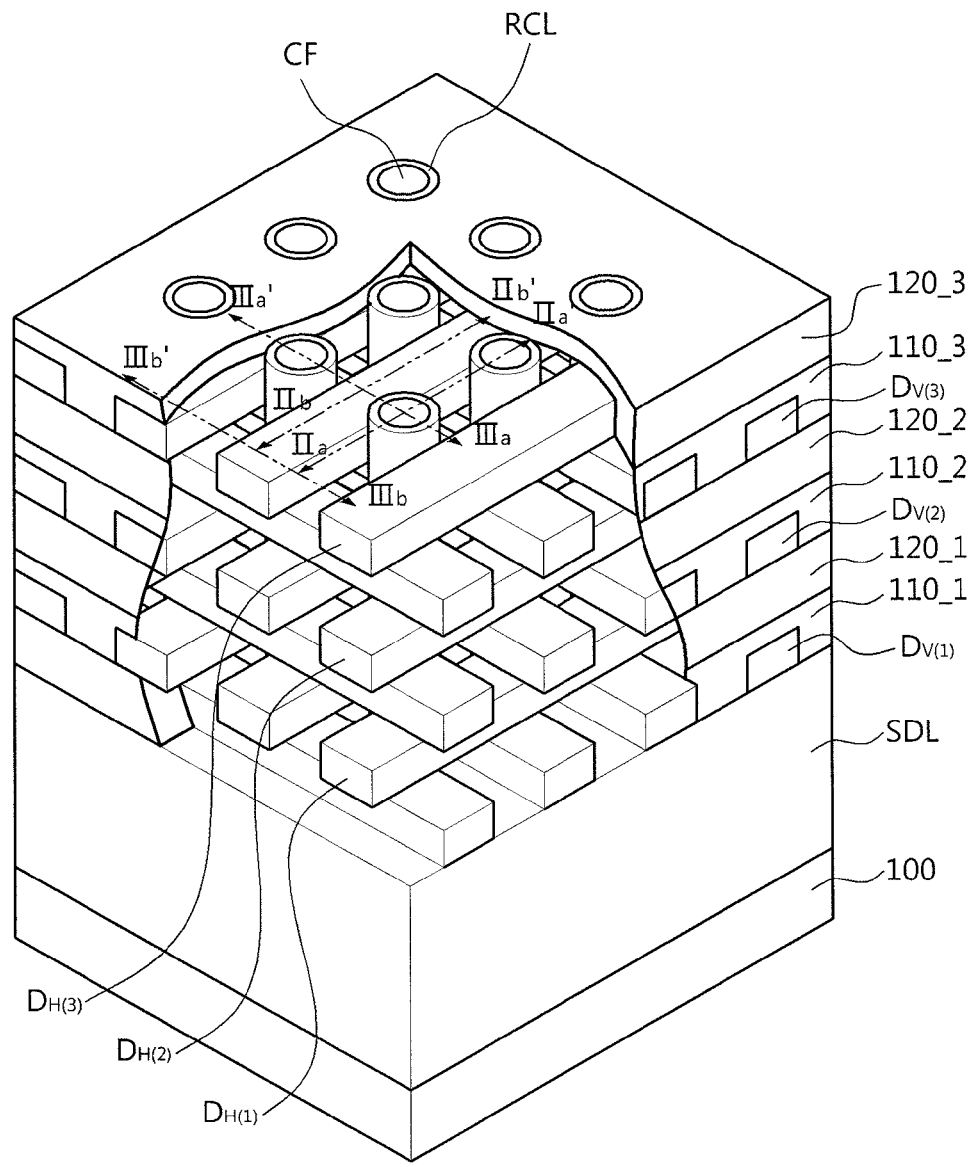
FIG. 19 is a partially exploded perspective view showing a resistance change memory device array in accordance with an exemplary embodiment of the present invention.
Figure 20:
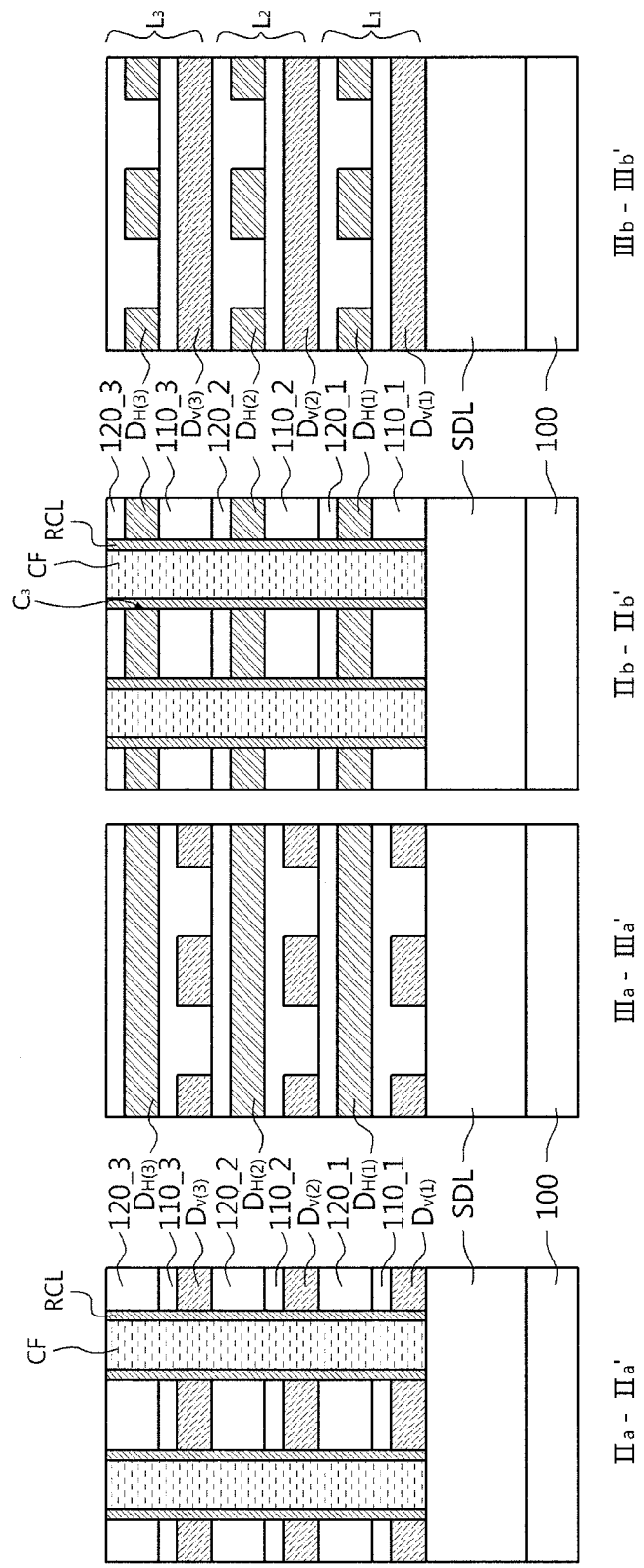
FIG. 20 is cross-sectional views showing a memory device layer taken along lines $II_a$-$II_a$', $II_b$-$II_b$', $III_a$-$III_a$', and $III_b$-$III_b$' of FIG. 19.

FIG. 19 is a partially exploded perspective view showing a resistance change memory device array in accordance with an exemplary embodiment of the present invention, and FIG. 20 is cross-sectional views showing a memory device layer taken along lines $II_a$-$II_a'$, $II_b$-$II_b'$, $III_a$-$III_a'$, and $III_b$-$III_b'$ of FIG. 19. A resistance change memory device array and a manufacturing method thereof in accordance with the present exemplary embodiment of the present invention may be substantially similar to those described with reference to 4 and 10 to 18 other than for those that will be described below.

Referring to FIGS. 19 and 20, a substrate 100 is provided. A selection device layer SDL is formed on the substrate 100 as described with reference to FIGS. 2, 5 and 6.

Then, a plurality of first directional data lines $D_{V(i)}$ (i=1) arranged parallel to each other may be formed on the selection device layer SDL. The pitch between the first directional data lines $D_{V(i)}$ (i=1) may be 1 F (F: feature size). The first directional data lines $D_{V(i)}$ (i=1) may also have a thickness of 1 F.

A first interwire insulating film 110_$i$ (i=1) may formed on the first directional data lines $D_{V(i)}$ (i=1) to cover them. The first interwire insulating film 110_$i$ (i=1) may have a thickness of 2 F, for example, so as to sufficiently fill the space between the first directional data lines $D_{V(i)}$ (i=1). The first interwire insulating film 110_$i$ (i=1) may be a silicon oxide layer.

Subsequently, the first interwire insulating film 110_$i$ (i=1) may be planarized. The planarization may be performed by chemical mechanical polishing (CMP).

Second directional data lines $D_{H(i)}$ (i=1), crossing the first directional data lines $D_{V(i)}$ (i=1) and arranged parallel to each other, may be formed on the planarized first interwire insulating film 110_$i$ (i=1). The pitch between of the second directional data lines $D_{H(i)}$ (i=1) may be 1 F (F: feature size). The second directional data lines $D_{H(i)}$ (i=1) may also have a thickness of 1 F.

A second interwire insulating film 120_$i$ (i=1) may be formed on the second directional data lines $D_{H(i)}$ (i=1) to cover them. The second interwire insulating film 120_$i$ (i=1) may have a thickness of 2 F, for example, so as to sufficiently fill the space between the second directional data lines $D_{H(i)}$ (i=1).

The first directional data lines $D_{V(i)}$ (i=1), the first interwire insulating film 110_$i$ (i=1), the second directional data lines $D_{H(i)}$ (i=1), and the second interwire insulating film 120_$i$ (i=1) may constitute a first unit layer $L_i$ (i=1). A second unit layer $L_2$ ($L_i$, i=2) may be formed on the first unit layer $L_1$ ($L_i$, i=1), and a third unit layer $L_3$ ($L_i$, i=3) may be formed on the second unit layer $L_2$ ($L_i$, i=2), thereby forming a plurality of unit layers on the substrate 100.

A plurality of contact holes $C_3$ may be formed in the second interwire insulating film 120_$i$ (i=1, 2 or 3) and the first interwire insulating film 110_$i$ (i=1, 2 or 3). The contact holes $C_3$ are formed in spaces surrounded by sidewalls facing each other of the first directional data lines $D_{V(i)}$ and sidewalls facing each other of the second directional data lines $D_{H(i)}$ such that a sidewall portion thereof can expose the sidewalls facing each other of the first directional data lines $D_{V(i)}$ and the sidewalls facing each other of the second directional data lines $D_{H(i)}$. The contact holes $C_3$ may extend up to the inside of the interlayer insulating films (denoted by reference numerals 30 and 40 in FIGS. 4 and 5) of the switching device SDL such that a bottom portion thereof can expose the interconnection pattern (denoted by reference numeral IC in FIGS. 4 and 5).

Here, the diameter of the contact hole $C_3$ can satisfy the following formula 2.

$$\max(a,b) \leq DM_H \leq \sqrt{a^2+b^2} \quad \text{[Formula 2]}$$

In formula 2, $DM_H$ represents the diameter of the contact hole $C_3$, a represents the interval between adjacent first directional data lines $D_{V(i)}$, and b represents the interval between adjacent second directional data lines $D_{H(i)}$.

If the diameter of the contact hole $C_3$ satisfies the above formula 2, the sidewalls facing each other of the first directional data lines $D_{V(i)}$ and the sidewalls facing each other of the second directional data lines $D_{H(i)}$ may be exposed through each of the contact hole $C_3$. However, unlike the contact hole $C_3$ described with reference to FIGS. 10 to 18, the contact hole $C_3$ may be in contact with a corner where the first directional data line $D_{V(i)}$ and the second directional data line $D_{H(i)}$ meet each other. In this exemplary embodiment, the first directional data line $D_{V(i)}$ and the second directional data line $D_{H(i)}$ are also isolated from each other by the interwire insulating film, and thus the first directional data lines $D_{V(i)}$ and the second directional data lines $D_{H(i)}$ may not be short circuited to each other.

A resistance change material layer RCL, which conformally covers the sidewall of the contact hole $C_3$, may be formed in the contact hole $C_3$. The resistance change material layer RCL may be in the form of spacers which are selectively formed on the sidewall of the contact hole $C_3$. As a result, the resistance change material layer RCL can cover the sidewalls facing each other of the first directional data lines $D_{V(i)}$ and the sidewalls facing each other of the second directional data lines $D_{H(i)}$.

A plurality of conductive pillars CF may be formed in the contact holes $C_3$ surrounded by the resistance change material layer RCL, respectively. As a result, the resistance change material layer RCL is positioned between both sidewalls of each conductive pillar CF and a pair of first directional data lines $D_{V(i)}$ and between the opposite sidewalls of each conductive pillar CF and a pair of second directional data lines $D_{H(i)}$. The conductive pillars CFs may be a Pt layer, a Ru layer, an Ir layer, or an Al layer, and preferably, the Al layer.

A tunnel barrier insulating film (not shown) covering the sidewalls of the data lines $D_{V(i)}$ and $D_{H(i)}$ may be formed in the contact holes $C_3$ before forming the resistance change material layer RCL. Otherwise, a tunnel barrier insulating film may be formed on the resistance change material layer RCL before forming the conductive pillar CF.

Figure 21:
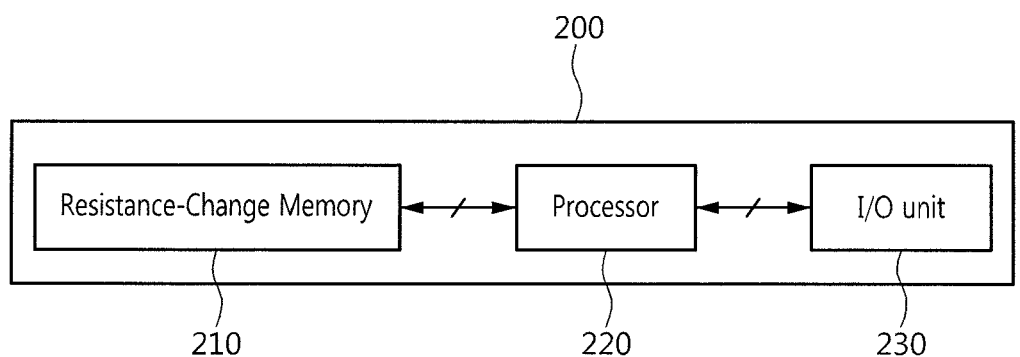
FIG. 21 is a schematic block diagram showing an electronic product adopting a resistance change memory as a data storage medium in accordance with an exemplary embodiment of the present invention.

FIG. 21 is a schematic block diagram showing an electronic product adopting a resistance change memory as a data storage medium in accordance with an exemplary embodiment of the present invention.

Referring to FIG. 21, an electronic product 200 includes at least one resistance change memory 210 as a data storage medium, a processor 220 connected to the resistance change memory 210, and an input/output unit 230 connected to the processor 220. Here, the resistance change memory 210 may include any one of the above-described resistance change memory device arrays.

The processor 220 may function to control the resistance change memory 210. Moreover, the electronic product 200 may exchange data with another electronic product through the input/output unit 230. The data communications between the processor 220 and the resistance change memory 210 as well as the data communications between the processor 220 and the input/output unit 230 may be established through data bus lines.

The electronic product 210 may be a data storage device such as a memory card, etc., an information processing device such as a computer, etc., a digital camera, or a cellular phone.

As described above, the resistance change memory device according to the present invention including the conductive pillar, the data line overlapping the sidewall of the conductive pillar, and the resistance change material layer positioned between the sidewall of the conductive pillar and the data line can increase the degree of integration. In detail, if a pair of data lines each overlapping both sidewalls of one conductive pillar are formed, a pair of unit devices share the one conductive pillar as an electrode, and thus the area of each unit device can be reduced. Accordingly, the degree of integration of the resistance change memory device can be increased. Further, if a pair of data lines each overlapping both sidewalls of one conductive pillar and the opposite sidewalls of the conductive pillar are formed, a pair of unit devices share the one conductive pillar as an electrode, and thus the area of each unit device can be further reduced.

Moreover, it is possible to selectively apply a voltage to the conductive pillars by electrically connecting selection devices to the conductive pillars.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A resistance change memory device array, comprising:
a pair of first directional data lines arranged parallel to each other on a substrate;
a conductive pillar positioned between sidewalls facing each other of the first data lines;
a resistance change material layer positioned between a sidewall of the conductive pillar and sidewall of the data line adjacent to the sidewall of the conductive pillar; and
second directional data lines crossing the first directional data lines and arranged parallel to each other on the first directional data lines,
wherein the conductive pillar is positioned in a space surrounded by the sidewalls facing each other of the first directional data lines and sidewalls of facing each other the second directional data lines.

2. The resistance change memory device array of claim 1, further comprising a tunnel barrier insulating film positioned between the sidewall of the conductive pillar and the resistance change material layer or between the resistance change material layer and the data line.

3. The resistance change memory device array of claim 1, wherein the resistance change material layer is a metal oxide layer, a PCMO ($Pr_{1-X}Ca_XMnO_3$, $0<X<1$) layer, a chalcogenide layer, a perovskite layer, or a metal-doped solid electrolyte layer.

4. The resistance change memory device array of claim 1, further comprising a selection device electrically connected to the conductive pillar.

5. The resistance change memory device array of claim 4, wherein the selection device is a selection transistor,
wherein the selection transistor is positioned at a cross point of a bit line and a word line crossing the bit line, respectively, and
wherein a gate of the selection transistor is electrically connected to the word line, any one of source and drain of the selection transistor is electrically connected to the bit line, and the other is electrically connected to the conductive pillar.

6. The resistance change memory device array of claim 4, wherein the selection device is a selection transistor,
wherein the selection transistor comprises an active area defined by a device isolation film formed on the substrate and a word line crossing the active area,
wherein the first directional data lines are arranged parallel to each other on the word line; and
wherein the conductive pillar is electrically connected to an active area exposed on one side of the word line.

7. The resistance change memory device array of claim 6, further comprising a bit line electrically connected to an active area exposed on the other side of the word line and crossing the top of the word line.

8. A resistance change memory device comprising:
a conductive pillar;
a data line overlapping a sidewall of the conductive pillar; and
a resistance change material layer positioned between the sidewall of the conductive pillar and the data line,
wherein the data line comprises
a pair of first directional data lines overlapping both sidewalls facing each other of the conductive pillar and arranged parallel to each other; and
a pair of second directional data lines overlapping both sidewalls facing each other of the conductive pillar and crossing the first directional data lines over the top of the first directional data lines.

9. The resistance change memory device of claim 8, further comprising a tunnel barrier insulating film positioned between the sidewall of the conductive pillar and the resistance change material layer or between the resistance change material layer and the data line.

10. The resistance change memory device of claim 8, further comprising a selection device electrically connected to the conductive pillar.

11. A method for manufacturing a resistance change memory device, the method comprising:
forming a pair of first directional data lines arranged parallel to each other in a first direction on a substrate;
forming a first interwire insulating film on the first directional data lines;
forming a hole exposing sidewalls facing each other of the first directional data lines in the first interwire insulating film;
forming a resistance change material layer covering the sidewalls of the data lines in the hole; and
forming a conductive pillar in the hole surrounded by the resistance change material layer,
before the forming the hole, forming a pair of second directional data lines crossing the first directional data lines and arranged parallel to each other on the first interwire insulating film; and
forming a second interwire insulating film on the second directional data lines,
wherein the hole is formed in the second interwire insulating film and the first interwire insulating film to expose the sidewalls facing each other of the first directional data lines and sidewalls facing each other of the second directional data lines.

12. The method of claim 11, further comprising, before the forming the resistance change material layer, forming a tunnel barrier insulating film covering the sidewalls of the data lines in the hole.

13. The method of claim 11, further comprising, before the forming the conductive pillar, forming a tunnel barrier insulating film on the resistance change material layer.

14. The method of claim 11, further comprising:
before the forming the first directional data lines on the substrate, forming a device isolation film on the substrate to define an active area; and
forming a word line crossing the active area,
wherein the first directional data lines are formed on the word line; and
wherein the conductive pillar is electrically connected to an active area exposed on one side of the word line.

15. An electronic product comprising a resistance change memory device and a processor connected to the resistance change memory device, wherein the resistance change memory device comprises:
a plurality of first directional data lines arranged parallel to each other on a substrate;
a conductive pillar positioned between sidewalls facing each other of the first data lines
a resistance change material layer positioned between a sidewall of the conductive pillar and a sidewall of the data line adjacent to the sidewall of the conductive pillar; and
second directional data lines crossing the first directional data lines and arranged parallel to each other on the first directional data lines,
wherein the conductive pillar is positioned in a space surrounded by the sidewalls facing each other of the first directional data lines and sidewalls facing each other of the second directional data lines.

16. The electronic product of claim 15, further comprising a tunnel barrier insulating film positioned between the sidewall of the conductive pillar and the resistance change material layer or between the resistance change material layer and the data line.

17. The electronic product of claim 15, further comprising a selection device electrically connected to the conductive pillar.

18. The electronic product of claim 17, wherein the selection device is a selection transistor,
wherein the selection transistor is positioned at a cross point of a bit line and a word line crossing the bit line, and
wherein a gate of the selection transistor is electrically connected to the word line, any one of source and drain of the selection transistor is electrically connected to the bit line, and the other is electrically connected to the conductive pillar.

* * * * *